(12) United States Patent
Domae et al.

(10) Patent No.: US 9,093,143 B2
(45) Date of Patent: Jul. 28, 2015

(54) NONVOLATILE SEMICONDUCTOR MEMORY DEVICE AND METHOD OF CONTROLLING THE SAME

(71) Applicant: KABUSHIKI KAISHA TOSHIBA, Minato-ku (JP)

(72) Inventors: Sumiko Domae, Yokohama (JP); Yoshihisa Iwata, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 164 days.

(21) Appl. No.: 14/016,487

(22) Filed: Sep. 3, 2013

(65) Prior Publication Data

US 2014/0286079 A1  Sep. 25, 2014

Related U.S. Application Data

(60) Provisional application No. 61/804,414, filed on Mar. 22, 2013.

(51) Int. Cl.
  *G11C 11/00* (2006.01)
  *G11C 13/00* (2006.01)
  *G11C 7/04* (2006.01)

(52) U.S. Cl.
  CPC .............. *G11C 13/004* (2013.01); *G11C 7/04* (2013.01); *G11C 13/0002* (2013.01); *G11C 13/0038* (2013.01); *G11C 13/0061* (2013.01); *G11C 13/0069* (2013.01); *G11C 2013/0076* (2013.01); *G11C 2213/71* (2013.01); *G11C 2213/77* (2013.01)

(58) Field of Classification Search
  USPC .......................................... 365/148, 157, 163
  See application file for complete search history.

(56) References Cited

U.S. PATENT DOCUMENTS

| 6,404,666 | B1 | 6/2002 | Uchida |
| 7,042,757 | B2 | 5/2006 | Perner |
| 7,054,183 | B2 | 5/2006 | Rinerson et al. |
| 7,245,526 | B2 | 7/2007 | Oh et al. |
| 7,248,494 | B2 | 7/2007 | Oh et al. |
| 7,249,894 | B1 | 7/2007 | Korn et al. |
| 7,379,364 | B2 | 5/2008 | Siau et al. |
| 7,830,701 | B2 | 11/2010 | Siau et al. |

(Continued)

FOREIGN PATENT DOCUMENTS

| JP | 2001-243783 | 9/2001 |
| JP | 2002-56686 | 2/2002 |

(Continued)

*Primary Examiner* — Vu Le
(74) *Attorney, Agent, or Firm* — Oblon, McClelland, Maier & Neustadt, L.L.P.

(57) ABSTRACT

A control circuit, on selecting a memory cell as a selected memory cell to perform a write operation, before executing the write operation, applies a first voltage to the selected memory cell via a first line and a second line to perform a first read operation. The control circuit, when judged that a result of the first read operation does not match write data intended to be written, executes the write operation. The control circuit, when judged that a result of the first read operation matches write data intended to be written, omits a voltage application operation for the write operation.

The first voltage is larger than a second voltage which is applied to the selected memory cell via the first line and the second line in a second read operation, the second read operation acting as a normal read operation for reading held data of the memory cell.

7 Claims, 17 Drawing Sheets

(56) References Cited

U.S. PATENT DOCUMENTS

| | | |
|---|---|---|
| 7,848,171 B2 | 12/2010 | Miyako |
| 7,978,501 B2 | 7/2011 | Chevallier et al. |
| 8,102,696 B2 | 1/2012 | Katoh et al. |
| 8,117,508 B2 | 2/2012 | Tokiwa |
| 8,446,768 B2 | 5/2013 | Toyama |
| 8,456,887 B2 | 6/2013 | Iwata |
| 2002/0181301 A1* | 12/2002 | Takahashi et al. ............ 365/200 |
| 2011/0032758 A1* | 2/2011 | Son et al. ................. 365/185.03 |

FOREIGN PATENT DOCUMENTS

| | | |
|---|---|---|
| JP | 2005-108395 | 4/2005 |
| JP | 2006-79812 | 3/2006 |
| JP | 2006-228414 | 8/2006 |
| JP | 2008-293619 | 12/2008 |
| JP | 2009-157982 | 7/2009 |
| JP | 2010-102827 | 5/2010 |
| JP | 2011-134389 | 7/2011 |
| WO | 2009/034687 A1 | 3/2009 |

* cited by examiner

● SET OPERATION $$\begin{cases} Vsb = Vsb\_s \\ Vsw = Vsw\_s \\ Vset = Vsb\_s - Vsw\_s \end{cases}$$

● RESET OPERATION $$\begin{cases} Vsb = Vsb\_r \\ Vsw = Vsw\_r \\ Vreset = Vsw\_r - Vsb\_r \end{cases}$$

(1) Setting Operation (2) Resetting Operation

Number of Times Selected << Number of Times Unselected

NONVOLATILE SEMICONDUCTOR MEMORY DEVICE AND METHOD OF CONTROLLING THE SAME

CROSS REFERENCE TO RELATED APPLICATIONS

This application is based on and claims the benefit of priority from prior U.S. prior provisional Patent Application No. 61/804,414, filed on Mar. 22, 2013, the entire contents of which are incorporated herein by reference.

FIELD

Embodiments described in the present specification relate to a nonvolatile semiconductor memory device and a method of controlling the same.

BACKGROUND

In recent years, resistance varying memory has been receiving attention as a successor candidate of flash memory. Resistance varying memory normally has a cross-point type structure configured having memory cells arranged in a matrix at intersections of a plurality of bit lines and a plurality of word lines intersecting the plurality of bit lines, each of the memory cells comprising a variable resistance element.

In this kind of cross-point type resistance varying memory, in order to perform a certain operation in a selected memory cell, a certain voltage is applied to a selected bit line and a selected word line. On the other hand, in an unselected memory cell, a voltage of an unselected bit line and an unselected word line is selected to avoid a change in held data. However, a certain amount of stress is inevitably applied to the unselected memory cell, and there is a risk that this stress causes data holding characteristics of the unselected memory cell to deteriorate.

DETAILED DESCRIPTION

A semiconductor memory device in an embodiment described below comprises: a memory cell array configured having memory cells arranged therein, the memory cells being disposed at intersections of a plurality of first lines and a plurality of second lines, the plurality of second lines being disposed to intersect the first lines, and the memory cells each including a variable resistance element; and a control circuit operative to control the memory cell array. The control circuit, in the case of selecting the memory cell as a selected memory cell to perform a write operation, before executing the write operation, applies a first voltage to the selected memory cell via the first line and the second line to perform a first read operation. The control circuit, when it is judged that a result of the first read operation does not match write data intended to be written by the write operation, executes the write operation. The control circuit, when it is judged that a result of the first read operation matches write data intended to be written by the write operation, omits a voltage application operation for the write operation. The first voltage is larger than a second voltage which is applied to the selected memory cell via the first line and the second line in a second read operation, the second read operation acting as a normal read operation for reading held data of the memory cell.

Next, embodiments of the present invention are described in detail with reference to the drawings.

[First Embodiment]

Figure 1:
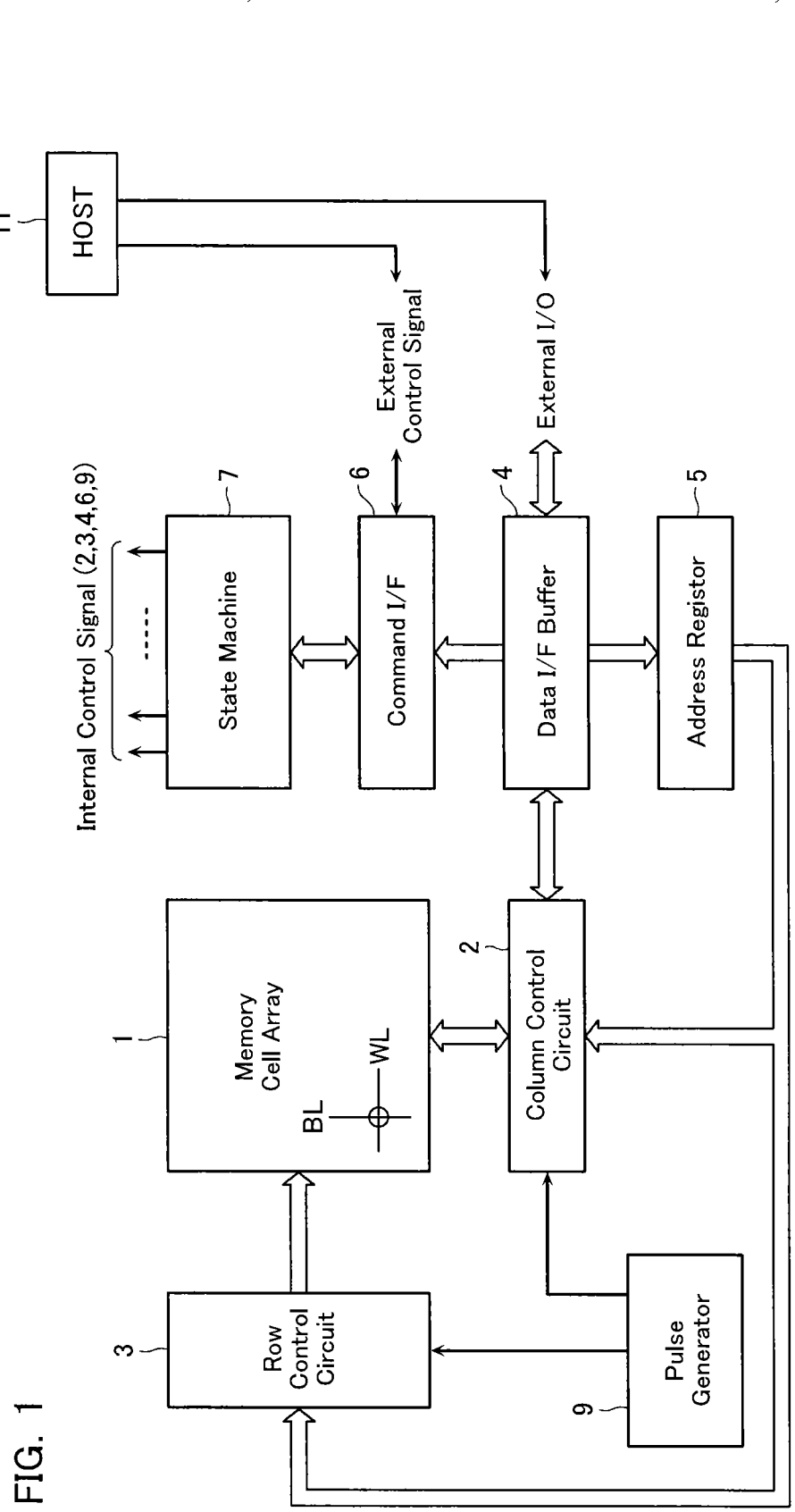
FIG. 1 is a block diagram of a nonvolatile memory according to a first embodiment.

FIG. 1 is a block diagram of a nonvolatile memory according to a first embodiment.

This nonvolatile memory comprises a memory cell array 1 having memory cells disposed in a matrix therein, each memory cell using a variable resistance element to be described later.

Provided at a position adjacent in a bit line BL direction of the memory cell array 1 is a column control circuit 2 that controls a bit line BL of the memory cell array 1 and applies a voltage required in data write to the memory cell and data read from the memory cell.

Moreover, provided at a position adjacent in a word line WL direction of the memory cell array 1 is a row control circuit 3 that selects a word line WL of the memory cell array 1 and applies a voltage required in data write to the memory cell and data read from the memory cell.

A data input/output buffer 4 is connected to an external host 11 via an I/O line to receive write data, output read data, and receive address data or command data.

The data input/output buffer 4 sends write data received to the column control circuit 2, and receives data read from the column control circuit 2 to be outputted to external. An address supplied to the data input/output buffer 4 from external is sent to the column control circuit 2 and the row control circuit 3 via an address register 5.

In addition, a command supplied to the data input/output buffer 4 from the host 11 is sent to a command interface 6. The command interface 6 receives an external control signal from the host 11, judges whether data inputted to the data input/output buffer 4 is write data or a command or an address, and if a command, receives the data and transfers the data to a state machine 7 as a command signal.

The state machine 7 performs management of this nonvolatile memory overall, receiving a command from the host 11 via the command interface 6, and performing read, write, management of input/output of data, and so on. In addition, it is also possible for status information managed by the state machine 7 to be received by the external host 11, thereby enabling an operation result to be judged by the external host 11. Moreover, this status information is utilized also in control of write. Furthermore, the state machine 7 controls a pulse generator 9. This control enables the pulse generator 9 to output a pulse of any voltage and any timing.

Now, the pulse formed by the pulse generator 9 can be transferred to any line selected by the column control circuit 2 and the row control circuit 3. Note that elements of peripheral circuits other than the memory cell array 1 can be formed in a Si substrate directly below the memory cell array 1 formed in a wiring layer, whereby chip area of this nonvolatile memory can be made substantially equal to area of the memory cell array 1.

Figure 2:
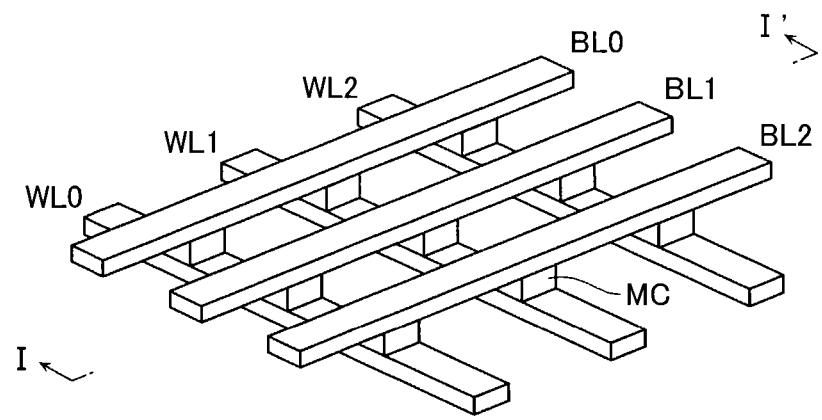
FIG. 2 is a perspective view of part of a memory cell array 1.
Figure 3:
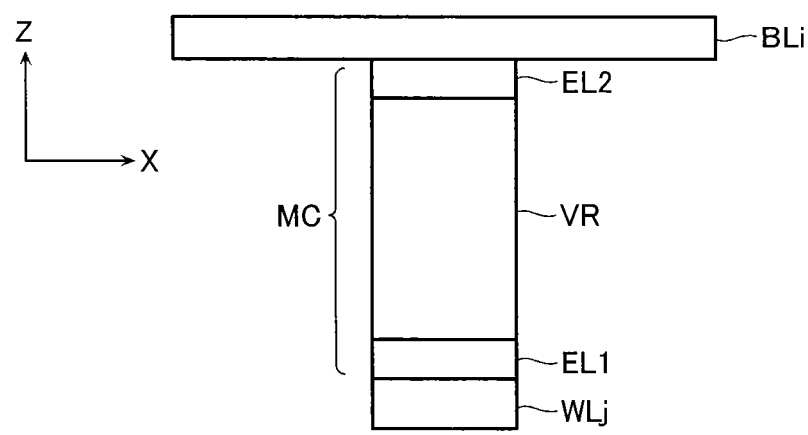
FIG. 3 is a cross-sectional view taken along the line I-I' looking in the direction of the arrows in FIG. 2, showing a single memory cell portion.

FIG. 2 is a perspective view of part of the memory cell array 1, and FIG. 3 is a cross-sectional view taken along the line I-I' and looking in the direction of the arrows in FIG. 2, showing a single memory cell portion. Word lines WL0-WL2 acting as a plurality of first lines are arranged in parallel, bit lines BL0-BL2 acting as a plurality of second lines are arranged in parallel intersecting these word lines WL0-WL2, and memory cells MC are disposed at each of intersections of these word lines and bit lines to be sandwiched by both lines. The first and second lines are desirably of a material that is heat resistant and has a low resistance value. For example, the likes of W, WSi, NiSi, and CoSi may be employed as the material.

As shown in FIG. 3, a memory cell MC is a circuit having a variable resistance element VR connected between the bit line BL and the word line WL. Disposed below and above the variable resistance element VR in a Z direction are electrodes EL1 and EL2 that function as a barrier metal and an adhesive layer. The variable resistance element VR is disposed on the electrode EL1, and the electrode EL2 is disposed on the variable resistance element VR. A material that includes a metal element is employed as an electrode material of the electrode EL2, the metal element configuring a conductive filament. The following may be selected as the metal element employed in the electrode EL2, namely, for example, Ag, Ni, Co, Al, Zn, Ti, Ta, Cu, and so on. The electrode EL2 may also further have the following stacked therein, namely, impurity-doped silicon, W, Ti, $TiN_x$, $TiSi_x$, $TiSi_xN_y$, Ta, $TaN_x$, and $TaSi_xN_y$. Various kinds of metal elements may be employed as the electrode EL1. The electrode EL1 may be selected from, for example, impurity-doped silicon, W, Ti, $TiN_x$, $TiSi_x$, $TiSi_xN_y$, Ta, $TaN_x$, and $TaSi_xN_y$, or stacked structures of these.

Figure 4:
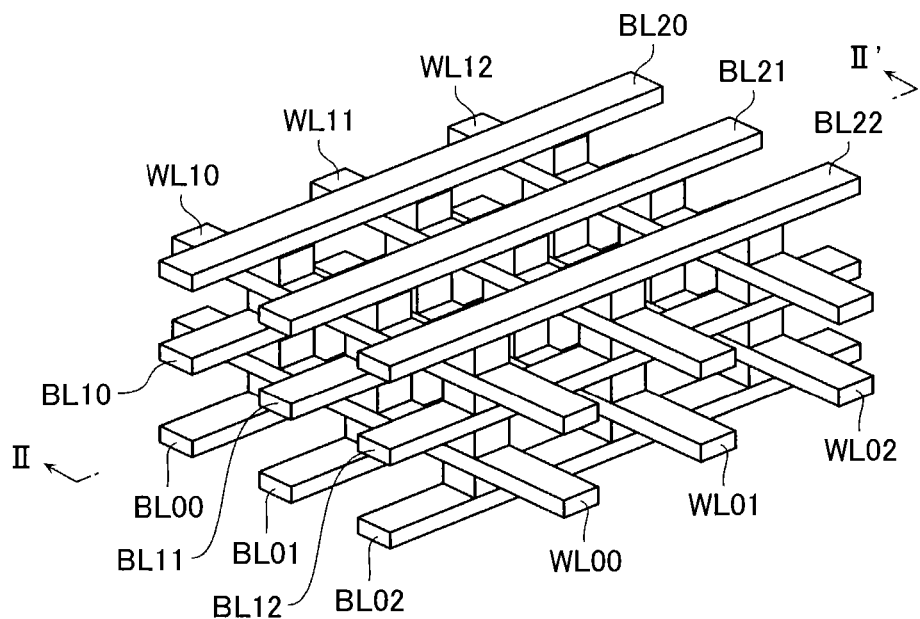
FIG. 4 is a perspective view of part of a memory cell array 1 in the case of adopting a three-dimensional structure of a multiply stacked memory structure.
Figure 5:
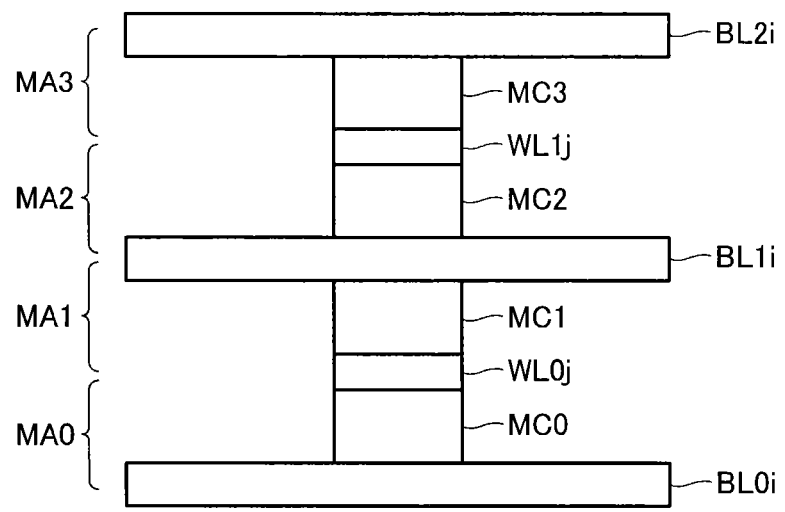
FIG. 5 is a cross-sectional view taken along the line II-II' of FIG. 4.

In addition, as shown in FIG. 4, it is also possible to adopt a three-dimensional structure having the above-described memory structure multiply stacked. FIG. 5 is a cross-sectional view showing a cross-section taken along the line II-II' of FIG. 4. The example illustrated is a memory cell array having a four layer structure configured from cell array layers MA0-MA3. Word line WL0j is shared by memory cells MC0 and MC1 below and above word line WL0j, bit line BL1i is shared by memory cells MC1 and MC2 below and above bit line BL1i, and word line WL1j is shared by memory cells MC2 and MC3 below and above word line WL1j.

Moreover, it is also possible to adopt a configuration interposing an interlayer insulating film between cell array layers such as line/cell/line/interlayer-insulating-layer/line/cell/line, rather than this repetition of line/cell/line/cell. Note that the memory cell array 1 may also be divided into several MATs of memory cell groups. The previously mentioned column control circuit 2 and row control circuit 3 may be provided to each MAT, each sector, or each cell array layer MA, or may be shared by these. Moreover, these control circuits may also be shared by a plurality of bit lines BL for reduction of area.

Figure 6:
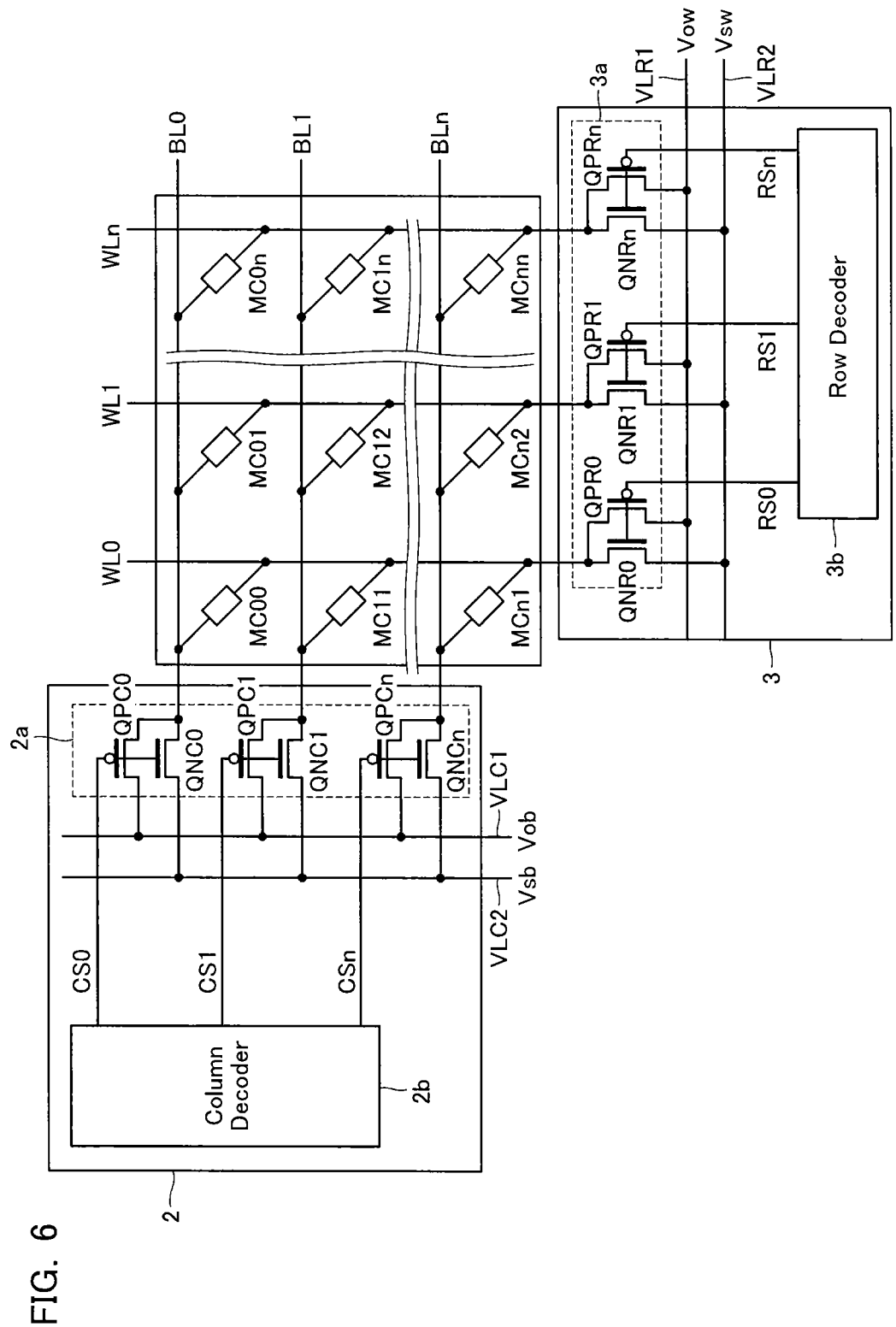
FIG. 6 is a schematic view showing a configuration of a column control circuit 2 and a row control circuit 3.

FIG. 6 is a schematic view showing a configuration of the column control circuit 2 and the row control circuit 3.

The column control circuit 2 comprises a column selection circuit 2a and a column decoder 2b. Moreover, although omitted from FIG. 6, the column control circuit 2 also comprises a sense amplifier circuit for detecting and amplifying a potential of the bit line BL. The column selection circuit 2a comprises a PMOS transistor QPCj and an NMOS transistor QNCj (j=0–n) for each one of the bit lines BL. Connected to one end of the PMOS transistor QPCj is a power supply line VLC1 that provides a voltage Vob applied to an unselected bit line. In addition, connected to one end of the NMOS transistor QNCj is a power supply line VLC2 that provides a voltage Vsb applied to a selected bit line.

The column decoder 2b provides a certain voltage to a column select line CS corresponding to a selected bit line and provides a certain voltage to a column select line CS corresponding to an unselected bit line, according to a column address supplied via the address register 5. The column select line CS is connected to a gate of the PMOS transistor QPCj and the NMOS transistor QNCj.

The row control circuit 3 comprises a row selection circuit 3a and a row decoder 3b. The row selection circuit 3a comprises a PMOS transistor QPRj and an NMOS transistor QNRj (j=0–n) for each one of the word lines WL. Connected to one end of the PMOS transistor QPRj is a power supply line VLR1 that provides a voltage Vow applied to an unselected word line. In addition, connected to one end of the NMOS transistor QNRj is a power supply line VLR2 that provides a voltage Vsw applied to a selected word line.

The row decoder 3b provides a certain voltage to a row select line RS corresponding to a selected word line and provides a certain voltage to a row select line RS corresponding to an unselected word line, according to a row address supplied via the address register 5. The row select line RS is connected to a gate of the PMOS transistor QPRj and the NMOS transistor QNRj.

Figure 7:
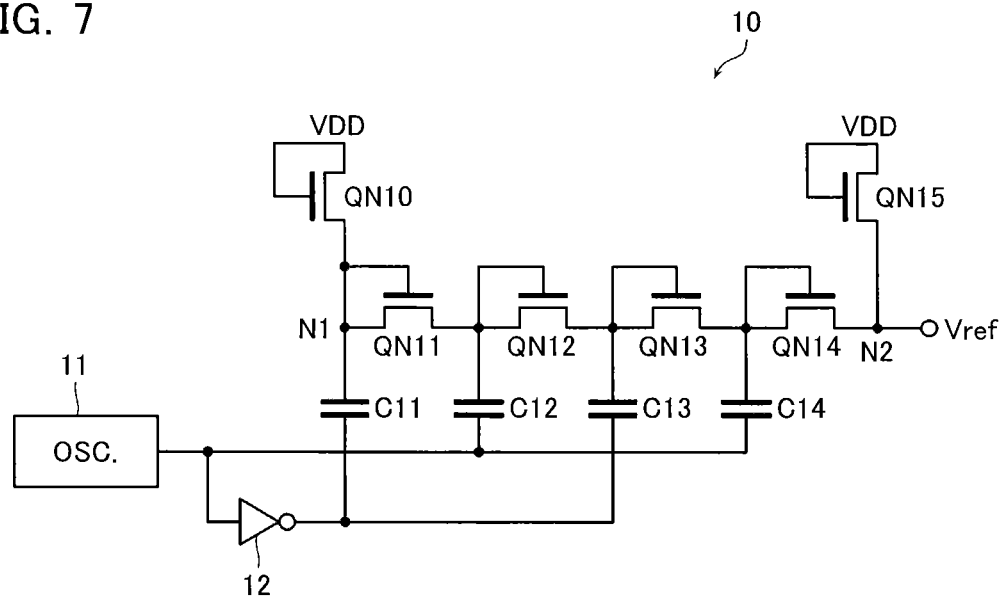
FIG. 7 is an example of a boost circuit included in a voltage generating circuit 10.

An example of configuration of a voltage generating circuit 10 in this first embodiment is described with reference to FIGS. 7 and 8. FIG. 7 is an example of a boost circuit included in the voltage generating circuit 10. In this boost circuit, diode-connected NMOS transistors QN11-QN14 are connected in series between nodes N1 and N2. Connected to the node N1 is an NMOS transistor QN10 that has its drain and gate supplied with a power supply voltage VDD and, moreover, connected likewise to the node N2 is an NMOS transistor QN15 that similarly has its drain and gate supplied with a power supply voltage VDD.

Respectively connected to drains of the NMOS transistors QN11-QN14 are one ends of capacitors C11-C14. The other ends of the capacitors C12 and C14 are supplied with an oscillating signal outputted from an oscillator 11, and the other ends of the capacitors C11 and C13 are supplied with an inverted signal which is the oscillating signal inverted by an inverter 12. Due to this oscillating signal being supplied, an output voltage of the node N2 is boosted to a certain reference voltage Vref.

Figure 8:
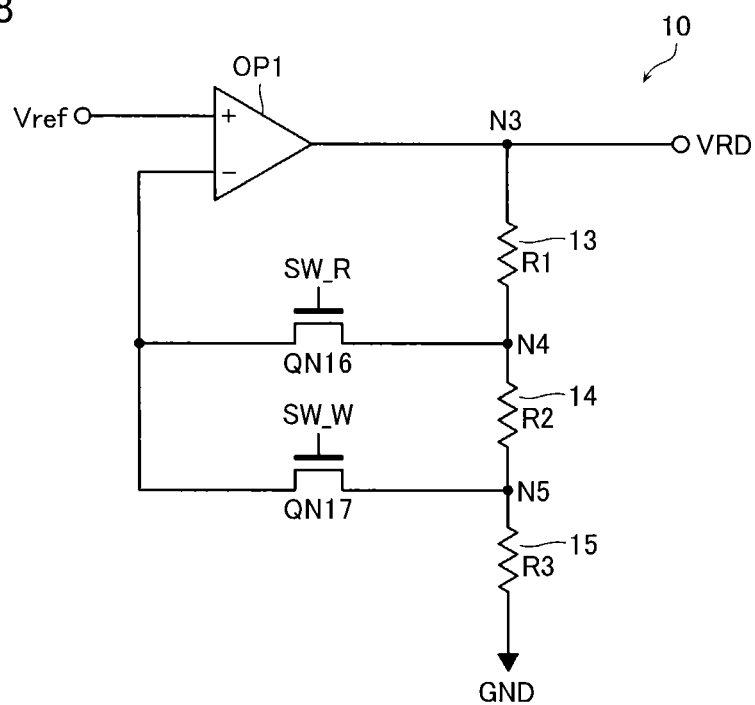
FIG. 8 is an amplifier included in the voltage generating circuit 10.

FIG. 8 is an amplifier included in the voltage generating circuit 10. This amplifier comprises an operational amplifier OP1, NMOS transistors QN16 and QN17, and resistors 13-15.

The operational amplifier OP1 has its non-inverting input terminal provided with the previously mentioned reference voltage Vref, and has its inverting input terminal connected to nodes N4 or N5 via the NMOS transistors QN16 and QN17. The resistor 13 is connected between a node N3 (output terminal of the operational amplifier OP1) and the node N4. The resistor 14 is connected between the node N4 and the node N5. The resistor 15 is connected between the node N5 and a ground terminal.

The NMOS transistors QN16 and QN17 are switched between a conductive state and a non-conductive state according to gate signals SW_R and SW_W. In the case where the transistor QN16 is in a conductive state and the transistor QN17 is in a non-conductive state, an output voltage VRD of the node N3 becomes a voltage VrN applied to both ends of a selected memory cell during a normal read operation. Note that the voltage VrN is expressed by the following formula.

$$VrN=(R1+R2+R3)/(R2+R3) \times Vref \quad \text{[Mathematical Formula 1]}$$

On the other hand, in the case where the transistor QN16 is in a non-conductive state and the transistor QN17 is in a conductive state, an output voltage VRD of the node N3 becomes a voltage VrH applied to both ends of a selected memory cell during a pre-write read operation to be described later. The voltage VrH is expressed by the following formula.

$$VrH=(R1+R2+R3)/R3 \times Vref \quad \text{[Mathematical Formula 2]}$$

As a result, the voltage VrH is larger than the voltage VrN.

Figure 9:
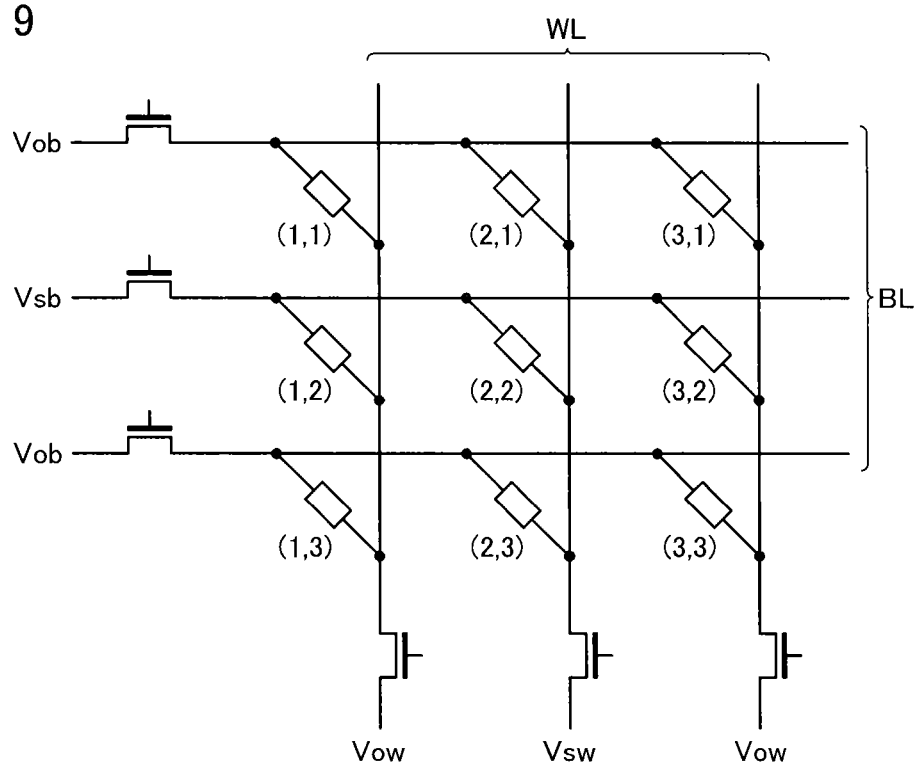
FIG. 9 is a schematic view explaining an operation for switching a resistance value of a selected memory cell from a high resistance state to a low resistance state (setting operation) and an operation for switching a resistance value of a selected memory cell conversely from a low resistance state to a high resistance state (resetting operation).

Next, an operation for switching a resistance value of a selected memory cell from a high-resistance state to a low-resistance state (setting operation) and an operation for switching a resistance value of a selected memory cell conversely from a low-resistance state to a high-resistance state (resetting operation) are described with reference to FIG. 9. In the description below, these setting operation and resetting operation are both referred to as a "write operation".

Now, description proceeds assuming that a memory cell MC(2,2) is selected as a selected memory cell in the setting operation and the resetting operation. To simplify description, FIG. 9 illustrates representatively only nine memory cells arranged in a 3×3 matrix. Now, a voltage applied to a selected bit line is defined as Vsb, a voltage applied to a selected word line is defined as Vsw, a voltage applied to an unselected bit line is defined as Vob, and a voltage applied to an unselected word line is defined as Vow.

In the setting operation, the voltage Vsb of the selected bit line is set to a voltage Vsb_s, and the voltage Vsw of the selected word line is set to a voltage Vsw_s (Vsb_s>Vsw_s). In addition, the voltage Vob of the unselected bit line is set to a voltage Vob_s, and the voltage Vow of the unselected word line is set to a voltage Vow_s. In order to perform the setting operation, a difference Vsb_s−Vsw_s between the above-described voltages Vsb_s and Vsw_s is applied to the selected memory cell MC(2,2) as a setting voltage Vset required to cause the setting operation.

Moreover, a voltage applied to unselected memory cells MC(1,1), MC(3,1), MC(1,3), and MC(3,3) located at intersections of unselected bit lines BL and unselected word lines WL is preferably set to zero. In order to do so, a value of the voltage Vob_s applied to the unselected bit lines and a value of the voltage Vow_s applied to the unselected word lines are preferably set equal (Vob_s=Vow_s). Now, the voltage Vob_s has a smaller value than the voltage Vsb_s, and the voltage Vow_s has a larger value than the voltage Vsw_s.

As a result, in this case, a voltage applied to half-selected memory cells MC(1,2) and MC(3,2) connected at intersections of the selected bit line and the unselected word lines is Vsb_s−Vow_s, and a voltage applied to half-selected memory cells MC(2,1) and MC(2,3) connected at intersections of the unselected bit lines and the selected word line is Vob_s−Vsw_s. These voltages Vsb_s−Vow_s and Vob_s−Vsw_s have a smaller voltage value than the setting voltage Vset applied to the selected memory cell but an identical polarity to the setting voltage Vset. Therefore, when the setting operation is performed on the selected memory cell MC(2,2), the half-selected memory cells MC(1,2), MC(3,2), MC(2,1), and MC(2,3) receive a voltage stress as a result. There is a risk that this voltage stress changes held data of the half-selected memory cells.

Next, the case of performing the resetting operation assuming the memory cell MC(2,2) to be the selected memory cell is described. When performing the resetting operation, voltages applied to the selected bit line BL, the unselected bit lines BL, the selected word line WL, and the unselected word lines WL are set to Vsb_r, Vob_r, Vsw_r, and Vow_r, respectively. The magnitude relationship of these voltages differs from the case of the setting operation as below.

In the resetting operation, the voltage Vsw_r applied to the selected word line is set larger than the voltage Vsb_r applied to the selected bit line, resulting in a resetting voltage Vreset (=Vsw_r−Vsb_r) being applied to the memory cell MC(2,2). The resetting voltage Vreset has an opposite polarity to the polarity of the setting voltage Vset.

In order to set to zero a voltage applied to the unselected memory cells MC(1,1), MC(3,1), MC(1,3), and MC(3, 3) located at intersections of the unselected bit lines and the unselected word lines, a value of the voltage Vob_r applied to the unselected bit lines and a value of the voltage Vow_r applied to the unselected word lines are preferably set equal (Vob_r=Vow_r). Now, the voltage Vob_r has a larger value than the voltage Vsb_r, and the voltage Vow_r has a smaller value than the voltage Vsw_r.

As a result, in this case, a voltage applied to half-selected memory cells MC(1,2) and MC(3,2) connected at intersections of the selected bit line and the unselected word lines is Vow_r−Vsb_r, and a voltage applied to half-selected memory cells MC(2,1) and MC(2,3) connected at intersections of the unselected bit lines and the selected word line is Vsw_r−Vob_r. These voltages Vow_r−Vsb_r and Vsw_r−Vob_r have a smaller voltage value than the resetting voltage Vreset applied to the selected memory cell MC(2,2) but an identical polarity to the resetting voltage Vreset. Therefore, when the resetting operation is performed on the selected memory cell MC(2,2), the half-selected memory cells MC(1,2), MC(3,2), MC(2,1), and MC(2, 3) receive a voltage stress as a result. There is a risk that this voltage stress changes held data of the half-selected memory cells.

Figure 10:
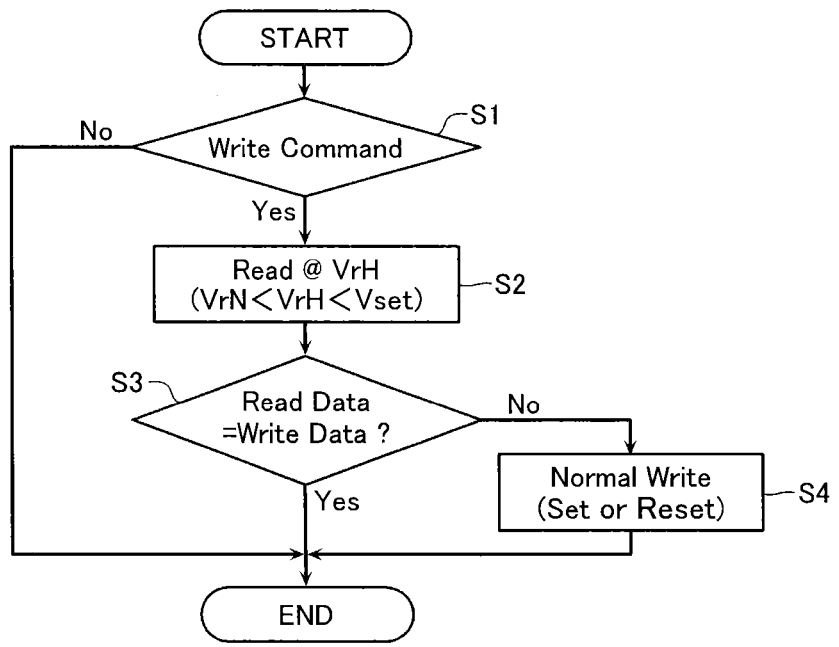
FIG. 10 is a flow chart showing a procedure of a write operation in the first embodiment.

In order to suppress application of such a voltage stress to the half-selected memory cells, the semiconductor memory device of the present embodiment executes an operation like that shown in FIG. 10 in the write operation (setting operation or resetting operation).

First, when a write command instructing the write operation (setting operation or resetting operation) to be performed is inputted, along with an address and data, from an external host device to the state machine 7 (S1), the state machine 7, before starting the write operation in accordance with the write command, executes a pre-write read operation (first read operation) on a memory cell (selected memory cell) indicated by the address inputted along with this write command. In this pre-write read operation, the selected memory cell MC is applied with the voltage VrH via the selected bit line and the selected word line to execute a read operation on the selected memory cell MC. As explained by FIG. 8, this voltage VrH has a larger voltage value than the voltage VrN applied to the selected memory cell via the selected bit line and the selected word line when a normal read operation (second read operation) is performed, and has an identical polarity to the voltage VrN. Moreover, this voltage VrH has a smaller voltage value than the setting voltage Vset employed in a normal setting operation, and has an identical polarity to the setting voltage Vset.

The state machine 7 judges whether data read by this pre-write read operation matches write data intended to be written thereafter by the write operation or not. If the read data matches the write data, then there is no need to implement the normal write operation (S4), hence a voltage application operation in the normal write operation is omitted and the write operation ends. If the read data does not match the write data, then a procedure shifts to the normal write operation, and the write operation (setting operation or resetting operation) on the selected memory cell is executed (S4).

[Advantages]

Figure 11:
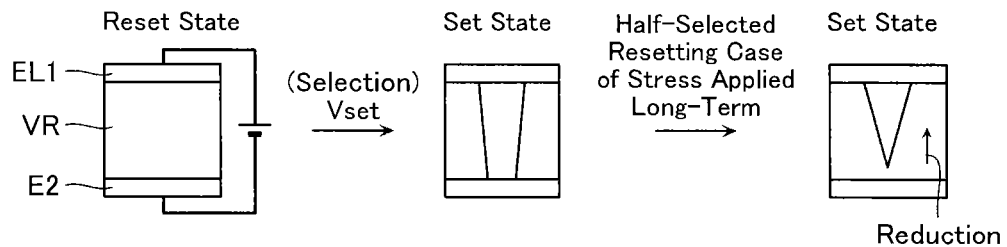
FIG. 11 is a schematic view showing advantages of the first embodiment.
Figure 11:
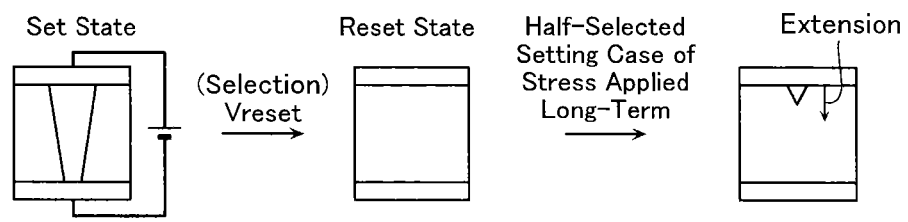

Advantages due to performing this pre-write read operation are described below. FIG. 11 is a schematic view showing a change in bridging of the variable resistance element VR in the memory cell MC in the case of performing the setting operation and the resetting operation.

The setting operation is an operation that, by applying the setting voltage Vset, causes bridging of the variable resistance element VR in the selected memory cell to extend, thereby causing the resistance value of the variable resistance element VR in the selected memory cell to fall. On the other hand, the resetting operation is an operation that, in the case of a bipolar type memory cell, by applying the resetting voltage Vreset of opposite polarity to the setting voltage Vset, causes bridging of the variable resistance element VR in the selected memory cell to be reduced or eradicated, thereby causing the resistance value of the variable resistance element VR in the selected memory cell to rise. A state where the resistance value of the variable resistance element VR has fallen to a certain value or less is called a "set state". To the extent that capacity of the memory cell array is increased, the number of memory cells connected to each of the word lines WL and bit lines BL increases, and the individual memory cells too have overwhelmingly more occasions of receiving a voltage application as a half-selected or unselected memory cell than of receiving a voltage application as a selected memory cell. Therefore, even if a certain memory cell is in a set state, subsequent stress (such as voltage in a resetting direction applied during half-selection) or time-dependent change lead to a possibility of bridging being reduced and a risk of reliability-related problems occurring.

On the other hand, a state where the resetting operation has caused the resistance value of the variable resistance element VR to rise to a value larger than a certain value is called a "reset state". In a memory cell in a reset state, stress in a setting direction applied during half-selection, and so on, lead to a possibility of bridging extending and a risk of reliability-related problems occurring.

In the present embodiment, the number of times of the write operation can be reduced to reduce stress on half-selected memory cells.

Figure 12:
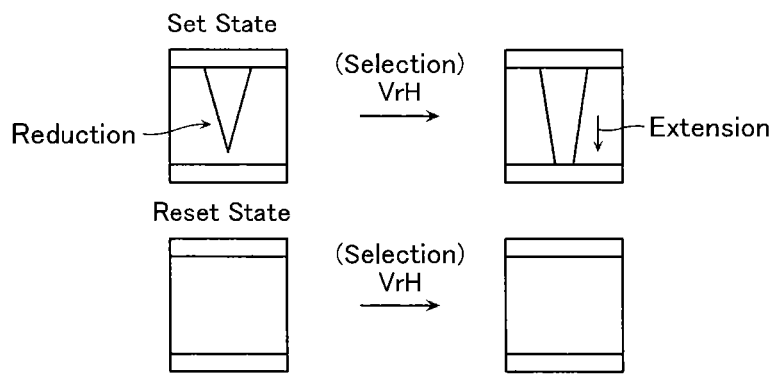
FIG. 12 is a schematic view showing advantages of the first embodiment.

When a memory cell in a set state where bridging has become reduced is selected as a selected memory cell in the setting operation, the previously described pre-write read operation (applied voltage VrH) is executed. In so doing, as shown in FIG. 12, the reduced bridging is caused to extend again by the applied voltage VrH of this pre-write read operation. This is because the voltage VrH is larger than the voltage VrN applied to a selected memory cell in a normal read operation. On the other hand, this voltage VrH is a smaller voltage than the setting voltage Vset, hence stress on half-selected memory cells is small compared to in the case of the setting operation.

Moreover, such a selected memory cell in a "set state" where bridging has been reduced, coupled also with the fact that bridging of the selected memory cell has been caused to extend again by the voltage VrH, is read as set state (low-resistance state) in the pre-write read operation. Therefore, a read result of the pre-write read operation and data intended to be written by the setting operation match. As a result, the write operation ends without the normal write operation of step S4 being performed (Yes of S3 in FIG. 10). In this case, stress on the half-selected memory cells is reduced compared to when performing a normal setting operation. This is because the setting voltage Vset applied to a selected memory cell in a normal setting operation is larger than the previously described voltage VrH. Executing the pre-write read operation applying this voltage VrH makes the normal write operation unnecessary, whereby stress on half-selected memory cells can be proportionately reduced.

Next, the case where the resetting operation is performed is described. When a write command instructing the resetting operation is outputted in step S1, then in step S2, the pre-write read operation is executed, whereby the selected memory cell is applied with the voltage VrH to execute a read operation on the selected memory cell. At this time, if the selected memory cell is in a set state, then the pre-write read operation applying the voltage VrH causes bridging of the selected memory cell to extend and the selected memory cell to be read as set state, but since a normal resetting operation is executed in step S4, data desired to be written can be written. On the other hand, when the selected memory cell is in a reset state, bridging does not extend simply by this voltage VrH being applied at time of selection.

Moreover, such a selected memory cell in a "reset state" is read as data corresponding to reset state in the pre-write read operation. Therefore, a read result of the pre-write read operation and data intended to be written by the resetting operation match. As a result, when it is judged in the pre-write read operation that the selected memory cell is already in a reset state, the write operation (resetting) ends without the normal write operation of step S4 being performed. Executing the pre-write read operation applying this voltage VrH makes the normal resetting operation unnecessary, whereby stress on half-selected memory cells can be proportionately reduced.

As described above, in the present embodiment, a pre-write read operation employing an applied voltage VrH is performed, whereby a subsequent write operation can be omitted based on a read result of the pre-write read operation. As a result, stress on half-selected memory cells can be reduced. Moreover, bridging of a memory cell that was reduced by a stress received during half-selection after being brought to a set state may be caused to grow again, whereby data holding characteristics of the memory cell can also be improved.

[Second Embodiment]

Figure 13:
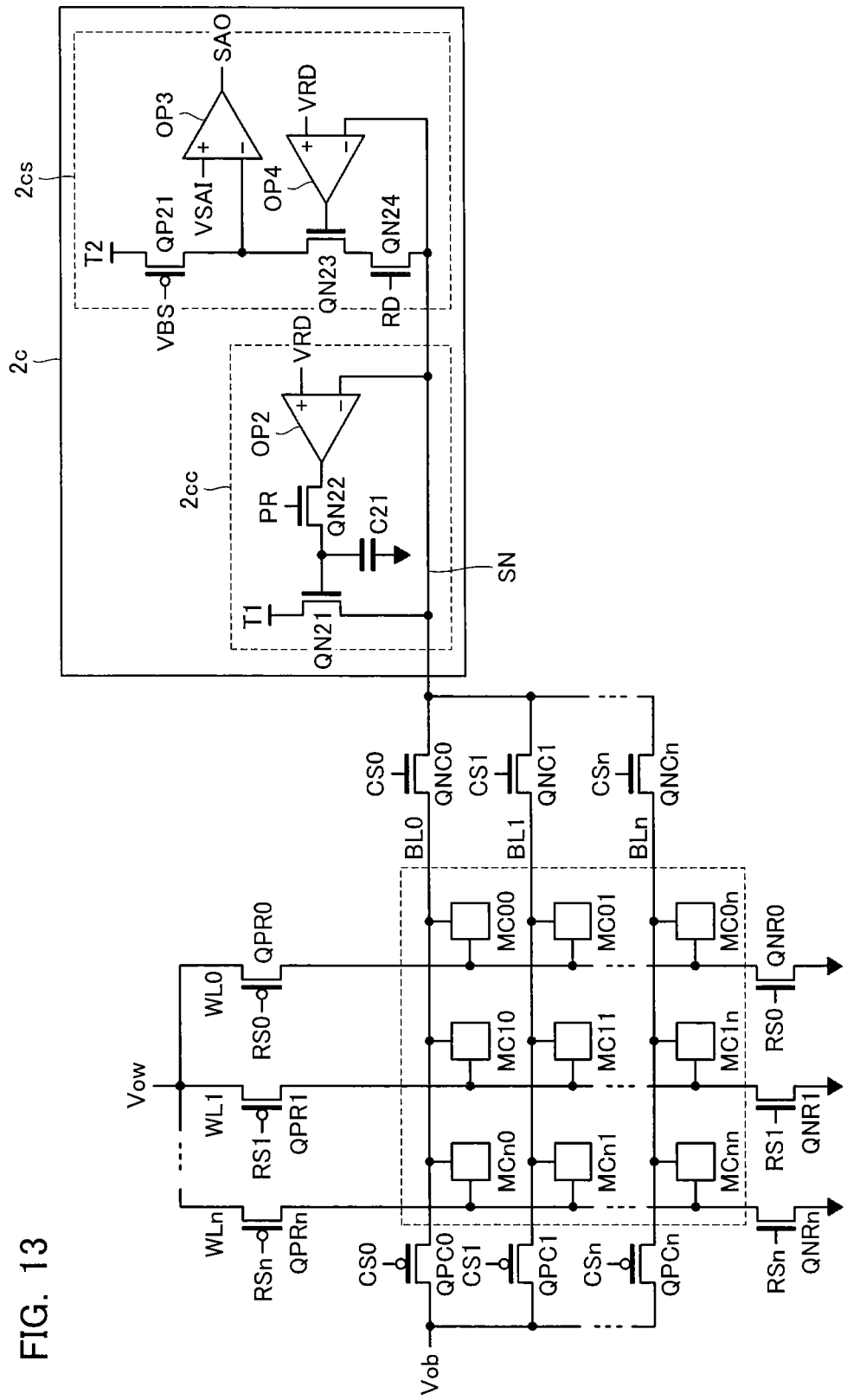
FIG. 13 is a circuit diagram showing a configuration of a sense amplifier circuit in a nonvolatile semiconductor memory device of a second embodiment.

Next, a nonvolatile semiconductor memory device according to a second embodiment is described with reference to FIGS. 13-14. A schematic configuration of the device is substantially identical to that in the first embodiment (FIGS. 1-8), hence a duplicated description of the schematic configuration is omitted below.

This second embodiment and later-described third through fifth embodiments are each embodiments for performing the following:

In a reading operation, a first time period is set where unselected bit lines and all word lines of the memory cell array are set to an unselected state, and a selected bit line is biased by a current;

Thereafter, a second time period is set where a selected word line is set to a selected state and biased with a current; and Using a current difference between each of these first time period and second time period to perform the read operation so as to avoid receiving an effect of off leak current due to cells in an unselected state.

The nonvolatile semiconductor memory device of this second embodiment has features in a structure of the sense amplifier circuit 2c in the column control circuit 2, in addition to features of the first embodiment.

The sense amplifier circuit 2c in this second embodiment comprises a mechanism for monitoring an off leak current flowing in an unselected memory cell during a read operation, and compensating a fall in potential of a selected bit line BL based on that off leak current. Specifically, the sense amplifier circuit 2c comprises a sensing unit 2cs for sensing a potential of the bit line BL, and a compensating circuit 2 cc for compensating the off leak current.

The compensating circuit 2 cc comprises NMOS transistors QN21 and QN22, a capacitor C21, and an operational amplifier OP2. The NMOS transistor QN21 forms a current path between a power supply terminal T1 and a sense node SN. The power supply terminal T1 is a power supply terminal that supplies the external power supply potential when an external power supply potential is higher than a voltage VRD to be described later by 2 V or more, and supplies a voltage higher by about 2 V than the voltage VRD generated internally in the device when it is not.

The capacitor C21 is connected between a gate of the NMOS transistor QN21 and a ground terminal. As mentioned later, this capacitor C21 is configured to hold a charge corresponding to a magnitude of the off leak current. The operational amplifier OP2 comprises an inverting input terminal connected to the sense node SN and a non-inverting input terminal supplied with the voltage VRD. The NMOS transistor QN22 forms a current path between an output terminal of the operational amplifier OP2 and the gate of the NMOS transistor QN21.

The sensing unit 2cs comprises a PMOS transistor QP21, NMOS transistors QN23 and QN24, and operational amplifiers OP3 and OP4.

The PMOS transistor QP21 and the NMOS transistors QN23 and QN24 are connected in series between a power supply terminal T2 and the sense node SN. The power supply terminal T2 must satisfy the same conditions as the power supply terminal T1. The power supply terminal T2 may be supplied with the same voltage as the power supply terminal T1.

During the read operation, the PMOS transistor QP21 and the NMOS transistors QN23 and QN24 supply a current to the bit line BL by a signal RD becoming "H". The operational amplifier OP3 has its inverting input terminal connected to a drain of the PMOS transistor QP21 and has its non-inverting input terminal provided with a reference voltage VSAI. Moreover, the operational amplifier OP4 has its inverting input terminal connected to the sense node SN and has its non-inverting input terminal supplied with the voltage VRD.

Next, a method of read in this second embodiment is described with reference to FIGS. 13 and 14. Described here as an example is the case where a read operation is performed assuming a memory cell MC00 to be a selected memory cell.

The read operation of this embodiment includes: an off leak current monitoring operation (times t1-t2 in FIG. 14) for monitoring an off leak current and storing a charge in the capacitor C21 in order to adjust a gate potential of the transistor QN21 allowing that current amount to flow; and a read operation (time t2—in FIG. 14) for performing a read of the memory cell while allowing a specified off leak current to flow.

Figure 14:
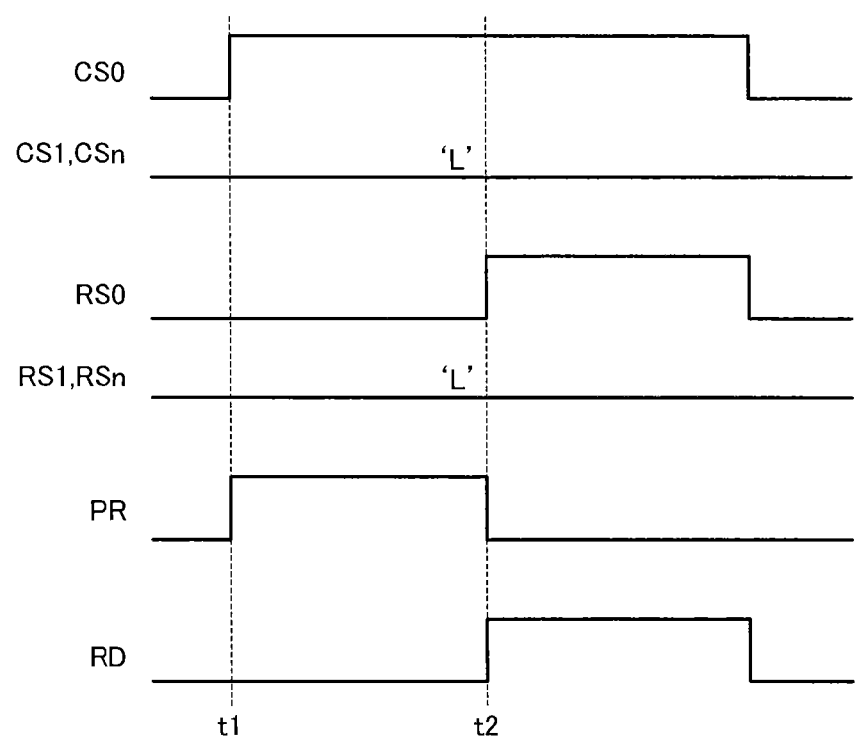
FIG. 14 is a timing chart showing operation of the nonvolatile semiconductor memory device in the second embodiment.

In the off leak current monitoring operation, first, as shown in FIG. 14, at time t1, a potential of the column select line CS0 is set to "H" rendering the transfer transistor QNC0 conductive, whereby the bit line BL0 connected to the selected memory cell MC00 is connected to the sense node SN. Moreover, the transistor QPC0 attains a non-conductive state. On the other hand, a potential of the other column select lines CS1, . . . CSn is maintained at "L". As a result, the transistors QNC1, . . . QNCn are set to a non-conductive state, while the transistors QPC1, . . . QPCn are set to a conductive state. At the same time, potentials of the row select lines RS0, RS1, . . . RSn are also all maintained at "L", whereby the transistors QNR0-QNRn are all set to a non-conductive state. As a result, in the read operation, the memory cell MC00 assumed to be the selected memory cell attains the same state as an unselected memory cell. The word lines WL0-WLn are charged to the voltage Vow via the transistors QPR0-QPRn. That is, all of the word lines are set to an unselected state. In addition, the bit lines BL1-BLn are supplied with the voltage Vob via the transistors QPC1, . . . QPCn. Moreover, during times t1-t2, a signal PR in the sense amplifier circuit 2c is set to "H", and the signal RD in the sense amplifier circuit 2c is set to "L". As a result, the sensing unit 2cs attains a non-activated state, and the compensating circuit 2cc attains an activated state.

When the above-described voltage application is performed, a potential of the sense node SN falls in proportion to an increase in off leak current in the unselected memory cells, and this potential of the sense node SN and the voltage VRD are differentially amplified by the operational amplifier OP2. Moreover, the operational amplifier OP2 outputs an output voltage corresponding to a change in the sense node SN, and charges the capacitor C21 with a charge corresponding to that output voltage. If a charging amount of the capacitor C21 is large, the transistor QN21 allows a larger current to flow. Charging of the capacitor C21 is continued in this way until the potential of the sense node SN and the voltage VRD balance out. As a result, the transistor QN21 functions to provide a current required to keep the bit line potential at the voltage VRD and thereby compensate a reduction in potential of the bit line BL due to an increase in off leak current.

Next, the read operation at time t2 and after is described. In this case, the signal PR in the sense amplifier circuit 2c is set to "L", and the signal RD in the sense amplifier circuit 2c is set to "H". As a result, the sensing unit 2cs attains an activated state. Moreover, in the compensating circuit 2cc, charging of the capacitor C21 is stopped, and the transistor QN21 is supplied with a current from the power supply terminal T1 in accordance with a gate voltage based on a potential charged to the capacitor C21.

In addition, to select the memory cell MC00, the column select line CS0 is set to "H", and the other column select lines CS1-CSn are set to "L". Moreover, the row select line RS0 is set to "H", and the other row select lines RS1-RSn are set to "L".

An off leak current flows from the unselected memory cells, whereby a potential of the bit line BL falls, but the compensating circuit 2cc causes a current corresponding to this off leak current to be supplied to the sense node SN. Therefore, effects of the off leak current are canceled out, thus making it possible to accurately sense the current flowing in the selected memory cell.

[Third Embodiment]

Figure 15:
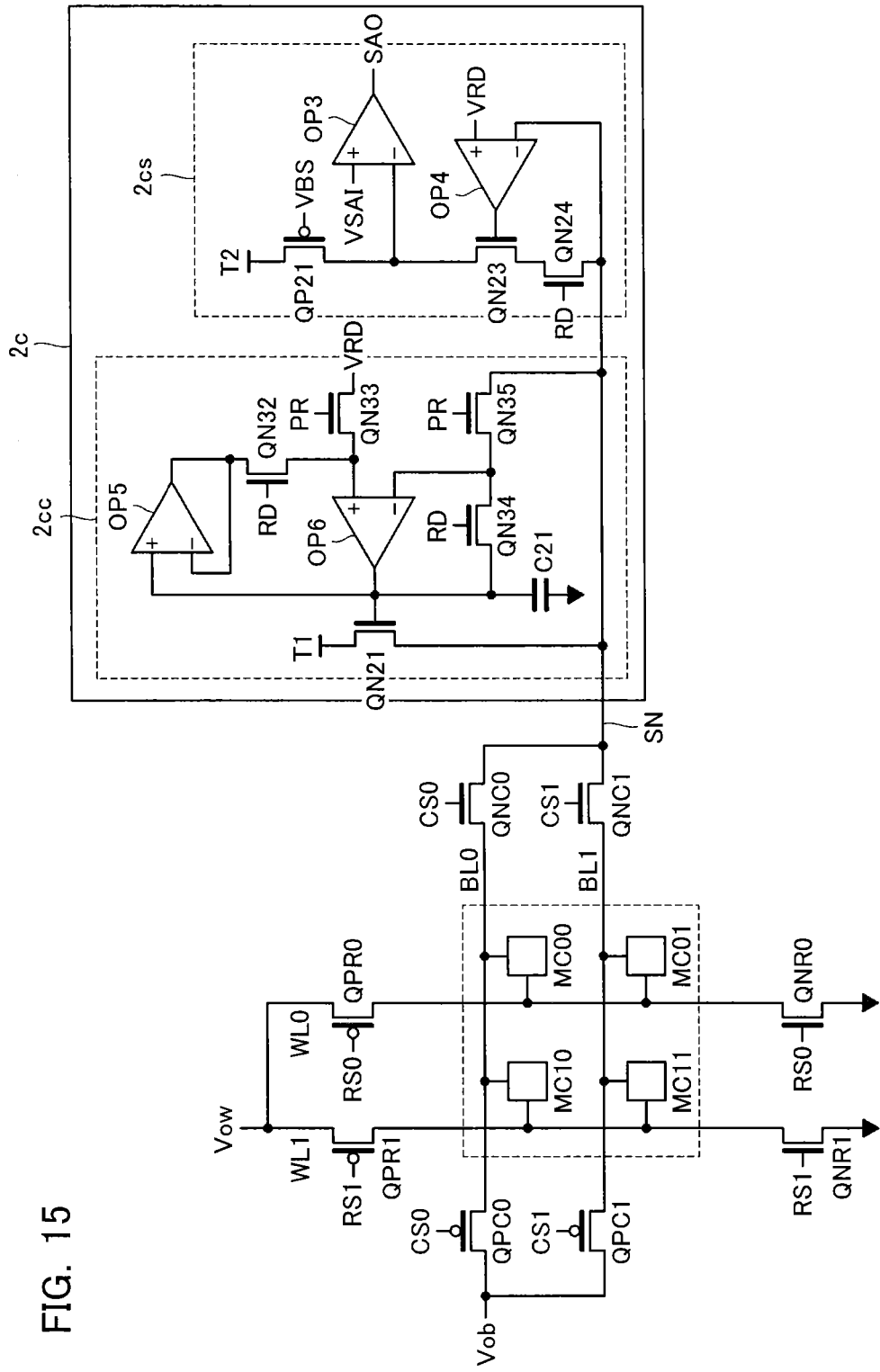
FIG. 15 is a circuit diagram showing a configuration of a sense amplifier circuit in a nonvolatile semiconductor memory device of a third embodiment.

Next, a nonvolatile semiconductor memory device according to a third embodiment is described with reference to FIG. 15. A schematic configuration of the device is substantially identical to that in the first embodiment (FIGS. 1-8), hence a duplicated description of the schematic configuration is omitted below. Moreover, configurative elements in FIG. 15 identical to those in FIG. 13 are assigned with identical symbols to those assigned in FIG. 13, and a duplicated description of such configurative elements is omitted below.

The nonvolatile semiconductor memory device of this third embodiment has features in a structure of the sense amplifier circuit 2c in the column control circuit 2, similarly to the second embodiment. The sense amplifier circuit 2c in this third embodiment comprises a mechanism for monitoring an off leak current flowing in an unselected memory cell during a read operation, and compensating a fall in potential of a selected bit line BL based on that off leak current. Specifically, the sense amplifier circuit 2c comprises a sensing unit 2cs for sensing a potential of the bit line BL, and a compensating circuit 2cc for compensating the off leak current.

A configuration of the sensing unit 2cs is identical to that of the second embodiment. A configuration of the compensating circuit 2cc is different from that of the second embodiment. The compensating circuit 2cc in this third embodiment comprises NMOS transistors QN21, QN32, QN33, QN34 and QN35, operational amplifiers OP5 and OP6, and a capacitor C21.

The NMOS transistor QN21 and the capacitor C21 are identical to those in the second embodiment. However, the NMOS transistor QN21 in this third embodiment is supplied directly with an output signal of the operational amplifier OP6. The operational amplifier OP5 has its non-inverting input terminal connected to the gate of the NMOS transistor QN21 and has its inverting input terminal connected to its own output terminal. The NMOS transistor QN32 is connected between the output terminal of the operational amplifier OP5 and a non-inverting input terminal of the operational amplifier OP6. The NMOS transistor QN32 has its gate supplied with the signal RD.

In addition, the operational amplifier OP6 has its non-inverting input terminal connected to one end of the NMOS transistor QN33. The other end of the NMOS transistor QN33 is supplied with the voltage VRD, and a gate of the NMOS transistor QN33 is supplied with the signal PR. Moreover, the NMOS transistor QN34 is connected between the output terminal and the inverting input terminal of the operational amplifier OP6, and the NMOS transistor QN34 has its gate supplied with the signal RD. The NMOS transistor QN35 is connected to form a current path between the inverting input terminal of the operational amplifier OP6 and the sense node SN.

The sense amplifier circuit 2c in this third embodiment has this configuration and, by changing the various kinds of signals with a similar timing to that of the second embodiment, is able to perform identical operations to those of the second embodiment. Moreover, during the read operation, a feedback loop is configured by the signal RD attaining "H", whereby current supply from the transistor QN21 can be accurately performed.

[Fourth Embodiment]

Figure 16:
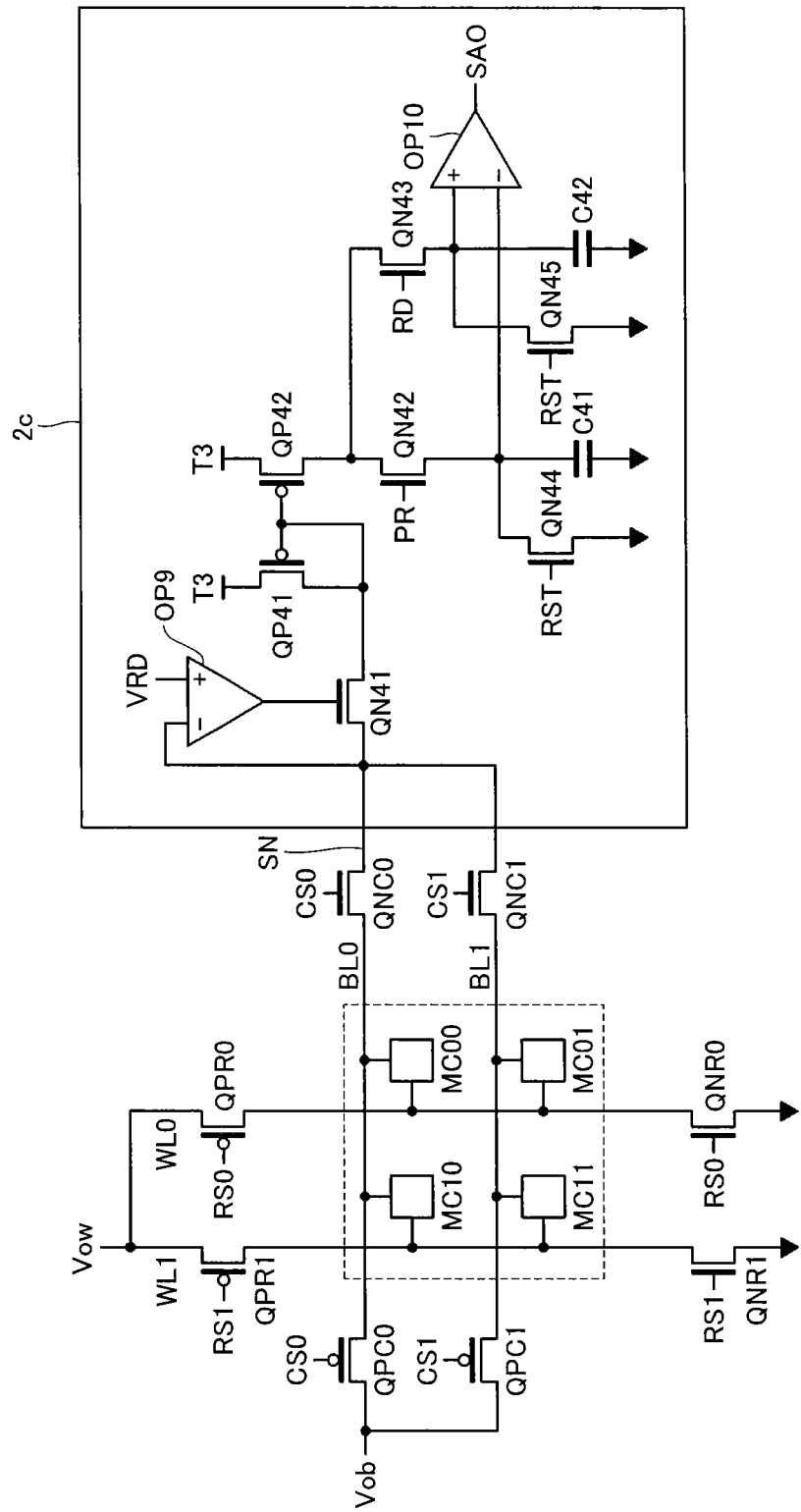
FIG. 16 is a circuit diagram showing a configuration of a sense amplifier circuit in a nonvolatile semiconductor memory device of a fourth embodiment.
Figure 17:
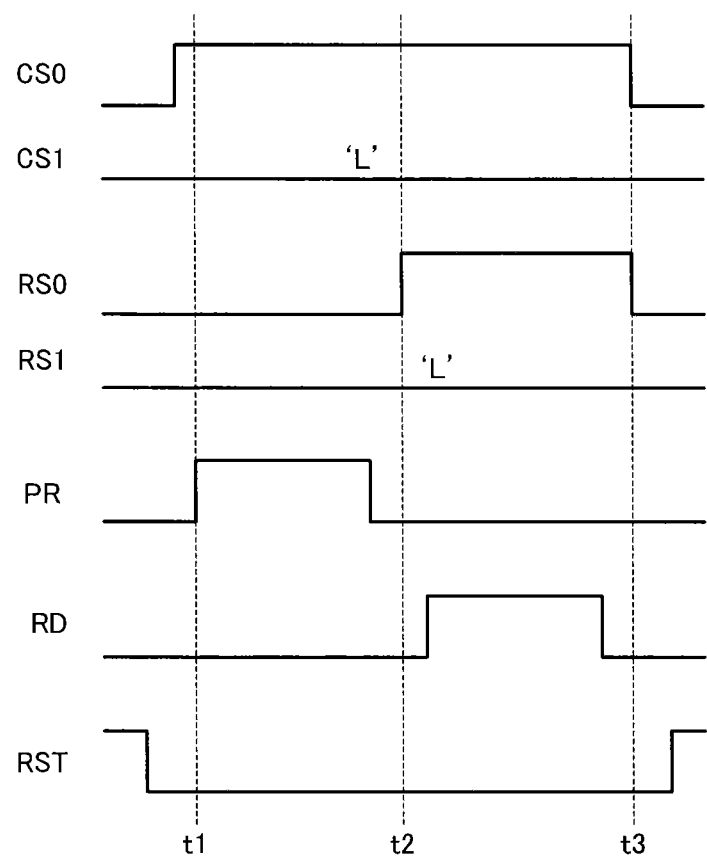
FIG. 17 is a timing chart showing operation of the nonvolatile semiconductor memory device in the fourth embodiment.

Next, a nonvolatile semiconductor memory device according to a fourth embodiment is described with reference to FIGS. 16 and 17. A schematic configuration of the device is substantially identical to that in the first embodiment (FIGS. 1-8), hence a duplicated description of the schematic configuration is omitted below. Moreover, configurative elements in FIG. 16 identical to those in FIG. 13 are assigned with identical symbols to those assigned in FIG. 13, and a duplicated description of such configurative elements is omitted below.

The nonvolatile semiconductor memory device of this fourth embodiment has features in a structure of the sense amplifier circuit 2c in the column control circuit 2, similarly to the second embodiment. The sense amplifier circuit 2c in this fourth embodiment comprises a mechanism for monitoring an off leak current flowing in an unselected memory cell during a read operation, and compensating a fall in potential of a selected bit line BL based on that off leak current. Specifically, the sense amplifier circuit 2c comprises operational amplifiers OP9 and OP10, NMOS transistors QN41-QN45, PMOS transistors QP41 and QP42, and capacitors C41 and C42. The operational amplifier OP9, the PMOS transistors QP41 and QP42, the NMOS transistors QN41, QN42 and QN44, and the capacitor C41 form a compensating circuit 2cc. The operational amplifier OP9, the PMOS transistors QP41 and QP42, the NMOS transistors QN41, QN43 and QN45, and the capacitor C42 configure a sensing unit 2cs.

The NMOS transistor QN41 has its one end connected to the sense node SN. The operational amplifier OP9 has its inverting input terminal connected to the sense node SN and has its non-inverting input terminal supplied with the voltage VRD.

The PMOS transistors QP41 and QP42 are current mirror connected, and the PMOS transistor QP41 has its drain connected to one end of the NMOS transistor QN41. A power supply terminal T3 is connected to the PMOS transistors QP41 and QP42. The sense amplifier circuit 2c is designed such that if an external power supply potential is higher by 2 V or more than the voltage VRD, the power supply terminal T3 is supplied with the external power supply, and the power supply terminal T3 is supplied with a potential higher by about 2 V than the voltage VRD generated internally in the device in other cases.

The NMOS transistors QN42 and QN43 have their drains connected to a drain of the PMOS transistor QP42. The NMOS transistor QN44 and the capacitor C41 are connected in parallel between a source of the NMOS transistor QN42 and a ground terminal. In addition, the NMOS transistor QN45 and the capacitor C42 are connected in parallel between a source of the NMOS transistor QN43 and a ground terminal. The NMOS transistors QN44 and QN45 have their gates provided with a resetting signal RST. Moreover, the operational amplifier OP10 has connected to its inverting input terminal and non-inverting input terminal one ends of the capacitors C41 and C42, respectively.

Next, a method of read in this fourth embodiment is described with reference to FIGS. 16 and 17. Described here as an example is the case where a read operation is performed assuming a memory cell MC00 to be a selected memory cell. The read operation of this embodiment too, similarly to that of the second embodiment, includes: an off leak current monitoring operation (times t1-t2 in FIG. 17) for monitoring an off leak current and storing in the capacitor C41 a charge corresponding to an amount of that off leak current; and a read operation (time t2-t3 in FIG. 17) for performing a read of the memory cell while allowing a specified off leak current to flow. Furthermore, the read operation of this embodiment includes a discharging operation (time t3—in FIG. 17) for discharging the charge of the capacitors C41 and C42.

Behavior of each of the signals in the off leak current monitoring operation is substantially identical to that in the second embodiment (FIG. 14). A change in potential of the sense node SN is detected by the operational amplifier OP9, and a current in a current mirror circuit configured from the PMOS transistors QP41 and QP42 changes according to that change in potential of the sense node SN. Moreover, a charge representing an integral value of the off leak current is stored in the capacitor C41.

In the read operation (t2-t3), the signal RD becomes "H", the change in potential of the sense node SN based on the current flowing in the selected memory cell is detected by the operational amplifier OP9, and that change is applied to the capacitor C42 via the current mirror circuit and the transistor QN43. The capacitor C42 is charged with a charge representing an integral value of a combined value of the off leak current in unselected cells and the current flowing in the selected memory cell MC. If the selected memory cell is in a set state (low-resistance state), the cell current increases, whereby the current amount stored in the capacitor C42 increases. Note that in order to set an output signal SAO of the operational amplifier OP10 to be "L" when the selected memory cell is in a reset state (high-resistance state), it is preferable to set a capacitance of the capacitor C42 to be larger than that of the capacitor C41, and to set a length of a time period that the signal PR="H" the same as a length of a time period that the signal RD="H". Alternatively, the capacitance of the capacitor C42 may be set equal to that of the capacitor C41, and instead the length of the time period that the signal PR="H" may be set longer than the length of the time period that the signal RD="H".

[Fifth Embodiment]

Next, a nonvolatile semiconductor memory device according to a fifth embodiment is described with reference to FIGS. 18 and 19. A schematic configuration of the device is substantially identical to that in the first embodiment (FIGS. 1-8), hence a duplicated description of the schematic configuration is omitted below.

The nonvolatile semiconductor memory device of this fifth embodiment has features in a structure of the sense amplifier circuit 2c in the column control circuit 2, similarly to the previously described embodiments. That structure closely resembles the structure of the fourth embodiment. Configurative elements in FIG. 18 identical to those in FIG. 16 are assigned with identical reference symbols to those assigned in FIG. 16, and a duplicated description of such configurative elements is omitted below.

Figure 18:
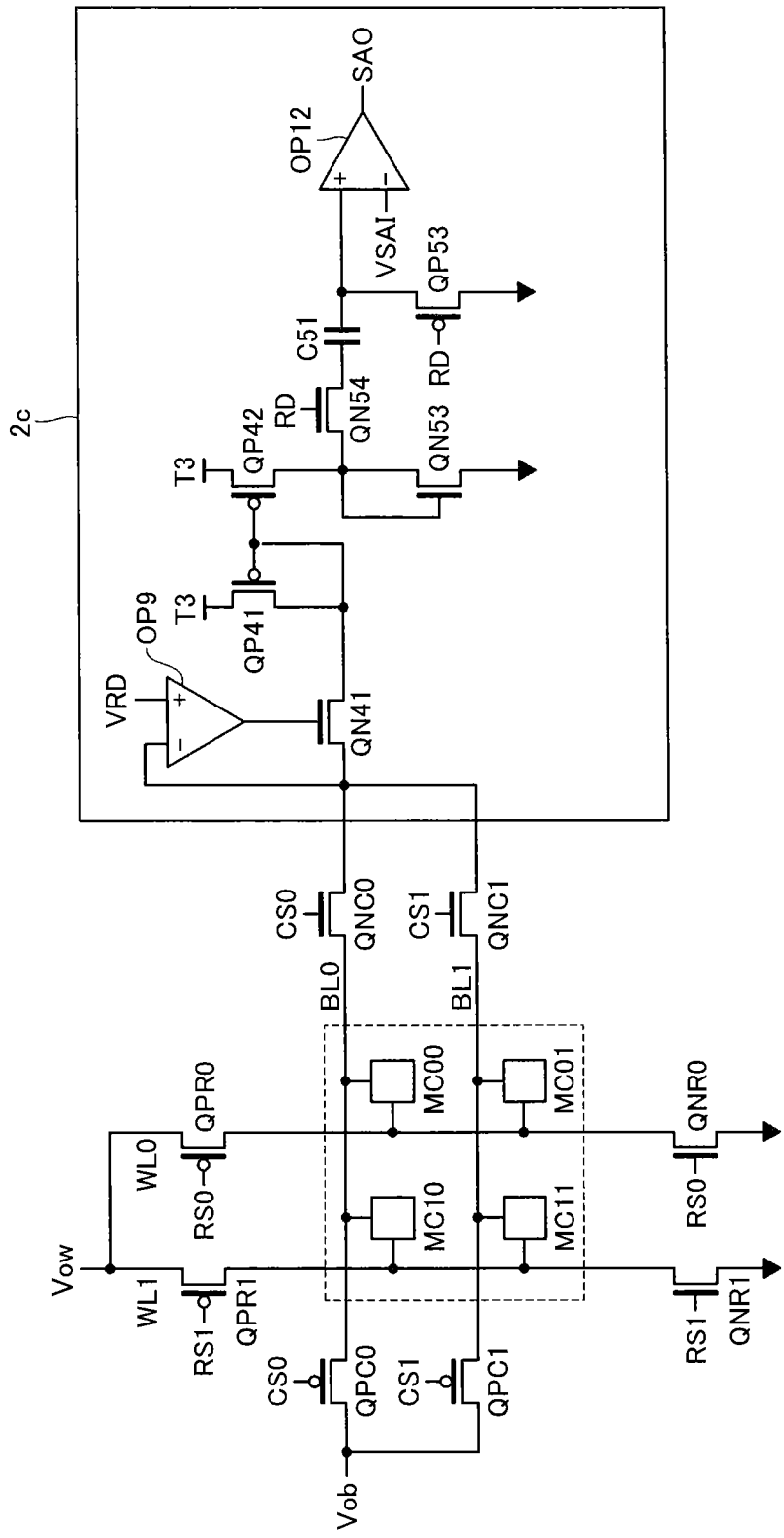
FIG. 18 is a circuit diagram showing a configuration of a sense amplifier circuit in a nonvolatile semiconductor memory device of a fifth embodiment.
Figure 19:
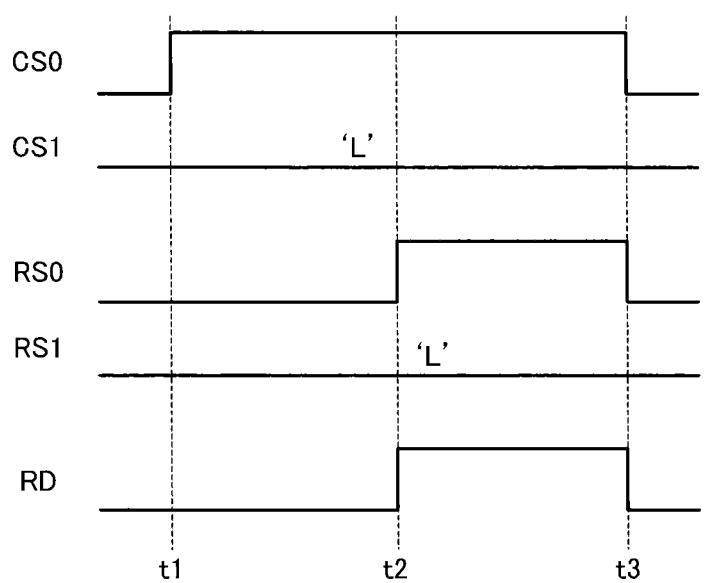
FIG. 19 is a timing chart showing operation of the nonvolatile semiconductor memory device in the fifth embodiment.

As shown in FIG. 18, in the sense amplifier circuit 2c of this fifth embodiment, an NMOS transistor QN54 and a capacitor C51 are connected between a drain of the PMOS transistor QP42 and a non-inverting input terminal of the operational amplifier OP12. Moreover, a diode-connected NMOS transistor QN53 is connected between the drain of the PMOS transistor QP42 and a ground terminal.

A PMOS transistor QP53 is connected between another end of the capacitor C51 (non-inverting input terminal of the operational amplifier OP12) and the ground terminal. These NMOS transistor QN54, capacitor C51, and PMOS transistor QP53 configure a switched capacitor.

Next, a method of read in this fifth embodiment is described with reference to FIGS. 18 and 19. Described here as an example is the case where a read operation is performed assuming a memory cell MC00 to be a selected memory cell. The read operation in this embodiment includes: an off leak current monitoring operation (times t1-t2 in FIG. 19) for monitoring an off leak current; and a read operation (time t2—in FIG. 19) for performing a read of the memory cell while allowing a specified off leak current to flow.

In the off leak current monitoring operation (times t1-t2), the signal RD="L", and a current corresponding to the off leak current flows in the transistors QP42 and QN53. Then, at time t2, when the signal RD becomes "H" and a cell current flows also in the selected memory cell, if that current amount is large, the capacitor C is pushed whereby a voltage of the non-inverting input terminal of the operational amplifier OP12 exceeds the reference voltage VSAI. If the cell current is small, the push amount is small, and the voltage of the non-inverting input terminal of the operational amplifier OP12 does not exceed the reference voltage VSAI. That push amount reflects also the current amount in the off leak current monitoring operation. Therefore, this embodiment too enables identical advantages to those of the previously described embodiments to be obtained.

[Other]

Figure 20:
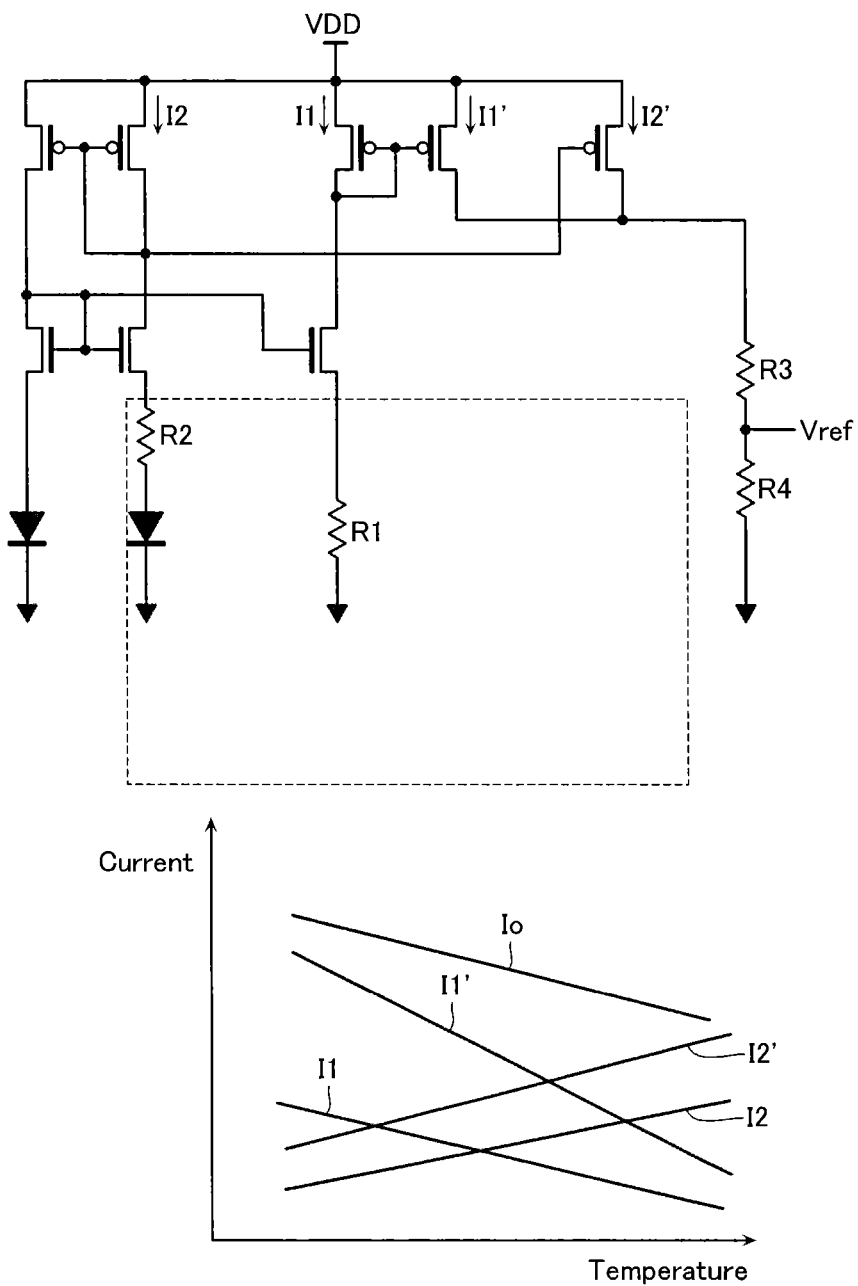
FIG. 20 is an example of configuration of a circuit for generating a reference voltage in an embodiment.
Figure 21:
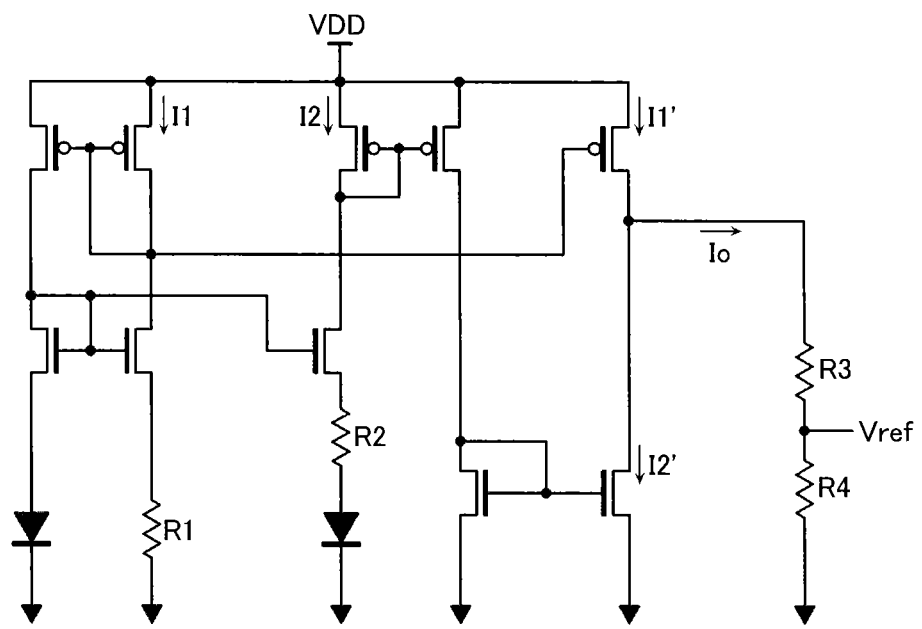
FIG. 21 is an example of configuration of a circuit for generating a reference voltage in an embodiment.
Figure 21:
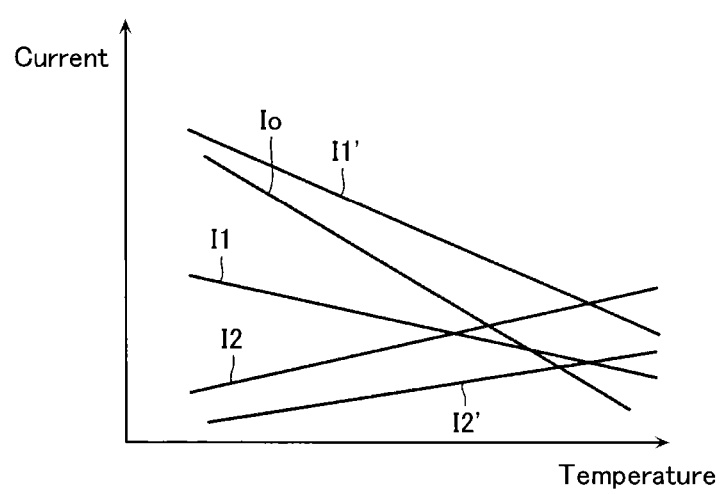

FIGS. 20 and 21 are examples of configuration of a voltage generating circuit for generating various kinds of reference voltages in the above-described embodiments. The setting voltage Vset and the resetting voltage Vreset for performing the setting operation and the resetting operation of the variable resistance element in the memory cell MC depend on temperature. Accordingly, employing circuits of the kinds shown in FIGS. 20 and 21 enables these voltages to be controlled to a voltage having a temperature-dependent characteristic.

The circuit of FIG. 20 generates a current I1' generated from a current I1 having a characteristic that current decreases with rising temperature and a current I2 having a characteristic that current increases with rising temperature, and synthesizes these to generate a current I0. The reference voltage VREF is generated by passing this current I0 through a dividing resistance of resistors R3 and R4.

Moreover, the circuit of FIG. 21 generates a current I1' generated from a current I1 having a characteristic that current decreases with rising temperature, and a current I2' generated from a current I2 having a characteristic that current increases with rising temperature. The circuit of FIG. 21 then generates a current I0 representing a difference in current between these current I1' and current I2'. The reference voltage Vref is generated by passing this current I0 through a dividing resistance configured from resistors R3 and R4.

The nonvolatile semiconductor memory devices according to the above-described second through fifth embodiments are configured such that, during a read operation, there is a time period where unselected bit lines and all word lines of the memory cell array are set to an unselected state and a selected bit line is biased with a current, and, following that, a time period where a selected word line is set to a selected state and biased with a current. Employing a current difference in each of the two time periods makes it possible to perform a read operation so as to avoid receiving an effect of off leak current due to cells in an unselected state.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array configured having memory cells arranged therein, the memory cells being disposed at intersections of a plurality of first lines and a plurality of second lines, the plurality of second lines being disposed to intersect the first lines, and the memory cells each including a variable resistance element; and
a control circuit operative to control the memory cell array, the control circuit being configured to, in the case of selecting the memory cell as a selected memory cell to perform a write operation,
before executing the write operation, apply a first voltage to the selected memory cell via the first line and the second line to perform a first read operation,
when it is judged that a result of the first read operation does not match write data intended to be written by the write operation, execute the write operation, and
when it is judged that a result of the first read operation matches write data intended to be written by the write operation, omit a voltage application operation for the write operation, and
the first voltage being larger than a second voltage which is applied to the selected memory cell via the first line and the second line in a second read operation, the second read operation acting as a normal read operation for reading held data of the memory cell.

2. The nonvolatile semiconductor memory device according to claim 1, wherein
the first voltage is smaller than a third voltage applied to the selected memory cell via the first line and the second line in the write operation.

3. A method of controlling a nonvolatile semiconductor memory device, the nonvolatile semiconductor memory device comprising a memory cell array configured having memory cells arranged therein, the memory cells being disposed at intersections of a plurality of first lines and a plurality of second lines, the plurality of second lines being disposed to intersect the first lines, and the memory cells each including a variable resistance element, the method comprising:
in the case of selecting the memory cell as a selected memory cell to perform a write operation,
before executing the write operation, applying a first voltage to the selected memory cell via the first line and the second line to perform a first read operation,
when it is judged that a result of the first read operation does not match write data intended to be written by the write operation, executing the write operation, and
when it is judged that a result of the first read operation matches write data intended to be written by the write operation, omitting a voltage application operation for the write operation,
the first voltage being larger than a second voltage which is applied to the selected memory cell via the first line and the second line in a second read operation, the second read operation acting as a normal read operation for reading held data of the memory cell.

4. The method of controlling a nonvolatile semiconductor memory device according to claim 1, wherein
the first voltage is smaller than a third voltage applied to the selected memory cell via the first line and the second line in the write operation.

5. A nonvolatile semiconductor memory device, comprising:
a memory cell array configured having memory cells arranged therein, the memory cells being disposed at intersections of a plurality of first lines and a plurality of second lines, the plurality of second lines being disposed to intersect the first lines, and the memory cells each including a variable resistance element;
a control circuit operative to control the memory cell array; and
a sense amplifier circuit operative to detect and amplify a potential of a sense node connected to the second line,
the sense amplifier circuit,
in a first time period, while applying a first unselected voltage to those of the plurality of second lines other than a selected second line, applying a second unselected voltage to all of the plurality of first lines, thereby causing a current to flow in the selected second line, and
in a second time period that follows the first time period, applying a first selected voltage to a selected first line to cause a current to flow in the selected second line.

6. The nonvolatile semiconductor memory device according to claim 5, wherein
the sense amplifier circuit is configured to,
in the first time period,
while measuring an off leak current flowing in an unselected memory cell set unselected and causing a charge corresponding to the measured off leak current to be held in a capacitor,
in the second time period,
cause a current to flow in a sense node connected to the second line, based on the charge stored in the capacitor.

7. The nonvolatile semiconductor memory device according to claim 5, wherein
a compensating circuit comprises a transistor for forming a current path between a power supply terminal and the sense node, and
the transistor is provided with a voltage of the capacitor.

* * * * *